(12) United States Patent
Takahashi

(10) Patent No.: US 8,837,241 B2
(45) Date of Patent: Sep. 16, 2014

(54) SEMICONDUCTOR MEMORY DEVICE

(71) Applicant: Renesas Electronics Corporation, Kawasaki (JP)

(72) Inventor: Hiroyuki Takahashi, Kawasaki (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 13/965,010

(22) Filed: Aug. 12, 2013

(65) Prior Publication Data

US 2014/0063996 A1    Mar. 6, 2014

(30) Foreign Application Priority Data

Aug. 30, 2012 (JP) ................................. 2012-189461

(51) Int. Cl.
*G11C 29/04* (2006.01)
(52) U.S. Cl.
CPC ....................................... *G11C 29/04* (2013.01)
USPC .......................................................... 365/200
(58) Field of Classification Search
CPC ........................................................ G11C 29/04
USPC ............................................................. 365/200
See application file for complete search history.

(56) References Cited

U.S. PATENT DOCUMENTS

| 7,458,004 | B2 | 11/2008 | Takahashi | |
|---|---|---|---|---|
| 7,692,943 | B2* | 4/2010 | Osada et al. | 365/51 |
| 7,814,300 | B2* | 10/2010 | Moyer et al. | 712/219 |
| 2005/0229077 | A1 | 10/2005 | Takahashi | |
| 2011/0255360 | A1* | 10/2011 | Takahashi | 365/219 |

FOREIGN PATENT DOCUMENTS

JP    2005-327437 A    11/2005

* cited by examiner

*Primary Examiner* — Hoai V Ho
*Assistant Examiner* — Tri Hoang
(74) *Attorney, Agent, or Firm* — McGinn IP Law Group, PLLC

(57) ABSTRACT

Disclosed is a semiconductor memory device that includes a late write register for temporarily storing a late write address and late write data. When a write command is input, the semiconductor memory device performs a dummy read, creates a data set having a predetermined bit width from data read by the dummy read and write data, and generates a correction bit from the data set. In parallel with the generation of the data set and the generation of the correction bit, the semiconductor memory device not only performs a late write to write the late write data at the late write address in the memory core, but also stores a write address in the late write register as a new late write address and stores the data set and the correction bit in the late write register as new late write data.

6 Claims, 9 Drawing Sheets

100

SEMICONDUCTOR MEMORY DEVICE

CROSS-REFERENCE TO RELATED APPLICATIONS

The disclosure of Japanese Patent Application No. 2012-189461 filed on Aug. 30, 2012 including the specification, drawings, and abstract is incorporated herein by reference in its entirety.

BACKGROUND

The present invention relates to a semiconductor memory device, and more specifically to a semiconductor memory device having, for example, an error correcting function.

A memory having an error correcting function, so-called ECC (Error Correcting Code) function, is well known. This type of memory generates a hamming code as a check bit for error correction during a write operation and writes the hamming code into a memory core together with data to be written (hereinafter referred to as the "write data"). During a read operation, this type of memory reads the hamming code from the memory core together with data to be read (hereinafter referred to as the "read data"), detects the location of an error (error bit) in the read data in accordance with the hamming code, and corrects the error. In the subsequent description, ECC-encoded data (i.e., "main data+hamming code") is referred to as the "ECC data".

The minimum number of bits of the hamming code is determined by adding the value 1 to the binary logarithm of data bus width. If, for instance, the data bus width is 32 bits, a hamming code of at least 6 bits is required. In this instance, a 1-bit error can be detected and corrected by a 6-bit hamming code. However, a 2-bit error can be merely detected by the 6-bit hamming code. Meanwhile, if a 7-bit hamming code is used in a situation where the data bus width is 32 bits, the 2-bit error can be detected and corrected.

The greater the data bus width, the larger the number of hamming code bits. The ratio between the number of hamming code bits and the data bus width decreases with an increase in the data bus width. Therefore, when the data bus width is increased for a memory having the ECC function and the hamming code is generated for each data, it is possible to reduce the cost of the ECC function.

As such being the case, the data bus width of memories tends to increase. Particularly, the data bus width of a DRAM (Dynamic Random Access Memory) included in an LSI (Large Scale Integration) circuit for an embedded system has a pronounced tendency to increase because it has no interface specification limitations unlike a general-purpose stand-alone memory.

An RMW (Read-Modify-Write) function is incorporated in the aforementioned memory so that write data having a bit width smaller than the data bus width can be written under normal conditions. When the write data has a bit width smaller than the data bus width, the RMW function generates the hamming code and writes it into the memory core after increasing the number of bits to match the data bus width by adding an adequate number of bits (this may be referred to as the "mask bits") to the data stored in the memory core. The RMW function is disclosed, for instance, in Japanese Unexamined Patent Publication No. 2005-327437.

As described in Japanese Unexamined Patent Publication No. 2005-327437, a memory having the RMW function first reads data (the number of bits is equivalent to the data bus width) at a relevant write address and a hamming code attached to the data from the memory core when writing write data having a bit width smaller than the data bus width. This read operation is called a dummy read.

Next, the ECC data read during the dummy read operation is subjected to ECC decoding. If any error is encountered, it is corrected. Next, bits corresponding to the mask bits of the write data, which are included in the decoded data, are added to the write data to generate a data set (the number of bits is equivalent to the data bus width).

Subsequently, the data set is subjected to ECC encoding for the purpose of generating the hamming code. Next, the ECC data including the data set and the hamming code is written into the memory core.

SUMMARY

An exemplary flow of processing performed by a memory having the RMW function will now be discussed with reference to FIG. 9. Referring to FIG. 9, "CLK", "COM", "ADD", "ECC ENC", "DATA/MASK", "ECC DEC", "DATA OUTPUT" respectively denote "a clock", "a command", "an address responsive to a command", "ECC encoding", "data (write data) input together with a write command and a signal indicative of mask bits (hereinafter referred to as the mask signal)", "ECC decoding", and "data output in compliance with a read command". The same also holds true for drawings referred to in the subsequent description.

In the example shown in FIG. 9, a write command "write", a write address A1, and a data signal D1 (write data and mask signal MASK) are first input to a memory at the rising edge of clock cycle T1 (at timing t1).

The memory performs a dummy read in cycle T1. More specifically, the memory selects a word line WL1 corresponding to the write address A1 to activate a memory cell on the word line WL1, and reads ECC data (ECC DATA in the figure) corresponding to the write address A1.

In cycle T2, the memory not only subjects the ECC data read in cycle T1 to ECC decoding (and error correction as well; the same applies hereinafter), but also creates a data set (DATA SET in the figure) having the same bit width as the data bus width from the ECC-decoded data and the data signal D1 input at timing t1 (write data/mask signal MASK).

Next, in cycle T3, the memory acquires the ECC data by subjecting the data set generated in cycle T2 to ECC encoding. Then, in cycle T4, the memory writes the ECC data into the memory core.

In the example shown in FIG. 9, a read command (READ) and a read address A2 are input at the rising edge of cycle T5 (at timing t5).

Hence, in cycle T5, the memory selects a word line WL2 corresponding to the read address A2 to activate a memory cell on the word line WL2, and reads ECC data corresponding to a write address A2.

Next, in cycle T6, the memory subjects the ECC data to ECC decoding to acquire read data Q2 having the same number of bits as the data bus width. Then, at the rising edge of the next cycle (at timing t7), the memory outputs the acquired read data Q2.

In the example shown in FIG. 9, at the rising edge of cycle T6 (at timing t6), a write command (WRITE), a write address A3, and a data signal D3 are input.

Hence, the memory performs a process beginning with a dummy read, for example, by selecting a word line WL3 corresponding to the write address A3, as is the case with cycle T1.

As is obvious from the example shown in FIG. 9, when the write data has a width smaller than the data bus width, the memory having the RMW function needs four cycles (cycles T1 to T4) to perform a process ranging from a write command input to a write into the memory core. Further, a state where the word line WL1 is selected persists during four cycles ranging from cycle T1 to cycle T4. However, the state where the word line WL1 is selected is required only for a dummy read in cycle T1 and for a write in cycle T4. This situation results in degradation of memory performance.

Other problems and novel features will become apparent from the following description and from the accompanying drawings.

According to an aspect of the present invention, there is provided a semiconductor memory device including a correction bit generation circuit and a late write register. The correction bit generation circuit generates a correction bit from data having a predetermined bit width. The late write register temporarily stores a late write address and late write data.

When a write command is input, the semiconductor memory device not only performs a dummy read to read data from a write address in a memory core, but also creates a data set having the predetermined bit width from the data read by the dummy read and write data and generates a correction bit from the created data set.

The semiconductor memory device performs a late write in parallel with the generation of the data set and of the correction bit. More specifically, the semiconductor memory device writes the late write data stored in the late write register into a memory cell of the memory core that corresponds to the late write address. Next, the semiconductor memory device regards the write address as a late write address and stores the data set and the correction bit into the late write register as new late write data.

It should be noted that, for example, an aspect expressed by replacing the semiconductor memory device according to the foregoing aspect by a method or a system and a system including the semiconductor memory device according to the foregoing aspect are also effective as an aspect of the present invention.

The semiconductor memory device according to the foregoing aspect can reduce the performance degradation of a memory having the RMW function.

BRIEF DESCRIPTION OF THE DRAWINGS

Embodiments of the present invention will be described in detail based on the following figures, in which.

DETAILED DESCRIPTION

Figure 1:
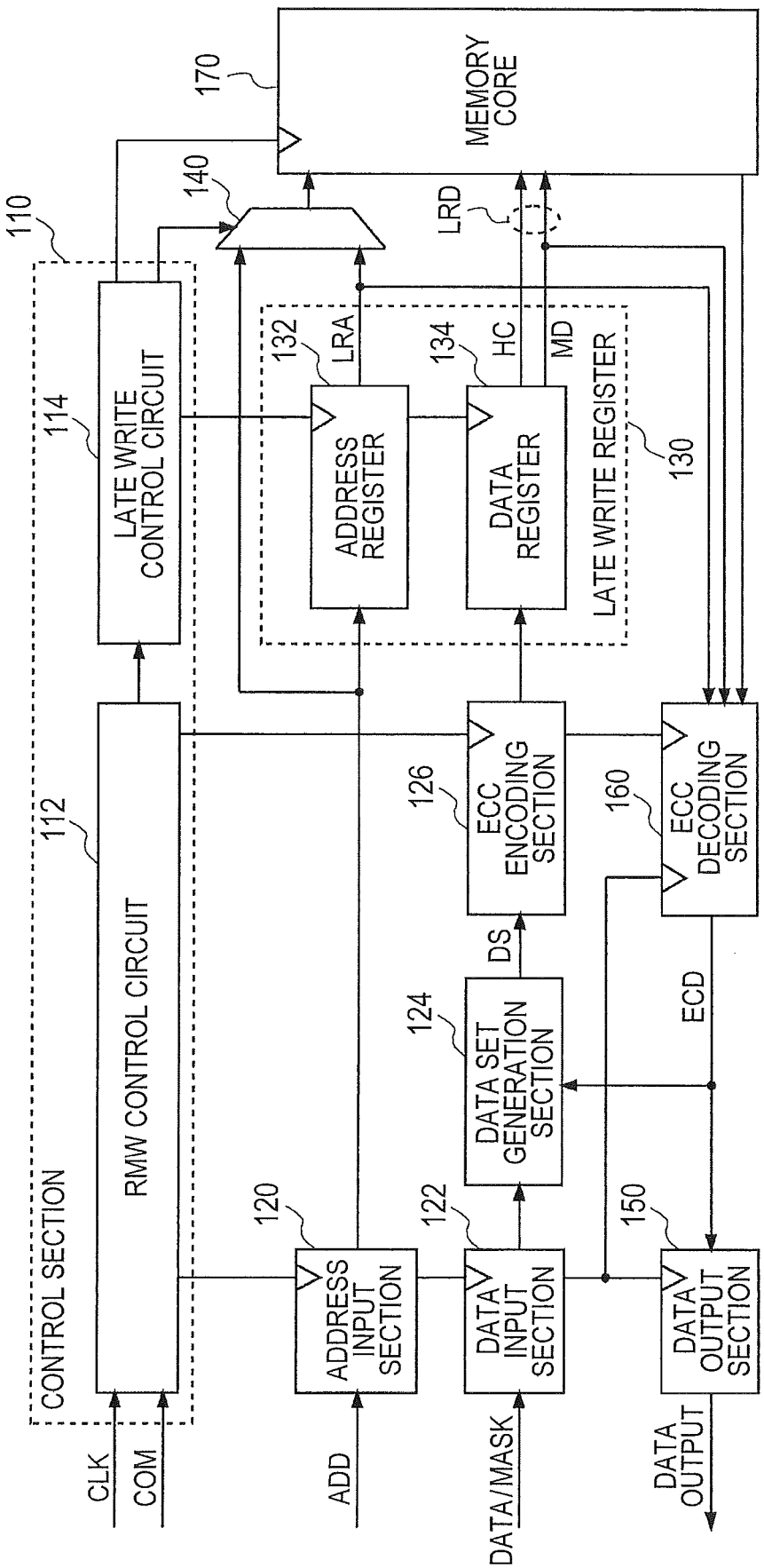
FIG. 1 is a diagram illustrating a semiconductor memory device according to a first embodiment of the present invention.

Embodiments of the present invention will now be described with reference to the accompanying drawings. In the following description and drawings, omissions and simplifications are made as needed for the clarification of explanation. Further, like elements in the drawings are designated by the same reference numerals and will not be redundantly described.

First Embodiment

FIG. 1 shows a semiconductor memory device 100 according to a first embodiment of the present invention. The semiconductor memory device 100 is, for example, a DRAM (Dynamic Random Access Memory), a SRAM (Static Random Access Memory), or a flash memory (registered trademark), and includes a control section 110, an address input section 120, a data input section 122, a data set generation section 124, an ECC encoding section 126, a late write register 130, a selector 140, a data output section 150, an ECC decoding section 160, and a memory core 170.

The semiconductor memory device 100 has an error correction function (ECC function), an RMW (Read-Modify-Write) function, and a later-described late write function. Its control section 110 includes an RMW control circuit 112 and a late write control circuit 114. The RMW control circuit 112 provides control for RMW. The late write control circuit 114 provides control for a late write.

For explanation purposes, it is assumed that the data bus width of the semiconductor memory device 100 is 32 bits, and that a hamming code used for error correction has 6 bits.

The control section 110 provides control over the other functional blocks and inputs a clock CLK and a command CMD. At least a read command and a write command are input as the command CMD. The RMW control circuit 112 and the late write control circuit 114, which are included in the control section 110, provide command-based control in synchronism with the clock CLK. Details of control provided by the control section 110 will be described together with the operations of the other functional blocks.

The semiconductor memory device 100 inputs an address ADD (read address or write address) together with the read command or with the write command. The address input section 120 is controlled by the RMW control circuit 112 to output the address ADD to the late write register 130 and to the selector 140 no matter whether the write command or the read command is input. Further, when the read command is input, the address input section 120 outputs the address ADD (read address) to the data input section 122 as well.

The data input section 122 is controlled by the RMW control circuit 112 to output data input to the semiconductor memory device 100 (including write data and a mask signal MASK) as well as the write command to the data set generation section 124. Further, when the read command is input, the data input section 122 transfers the read address received from the address input section 120 to the data output section 150 and to the ECC decoding section 160.

The data set generation section 124 generates a data set DS corresponding to the data from the data input section 122 and outputs the data set DS to the ECC encoding section 126. The data set DS has a bit width of 32 bits, which is equivalent to the data bus width. The data set generation section 124 generates the data set DS from the write data and mask signal MASK, which are input to the semiconductor memory device 100 together with the write command, and from data ECD (32-bit) received from the ECC decoding section 160. The generation of the data set DS by the data set generation section 124 and the data ECD from the ECC data decoding section 160 will be described in detail later.

The ECC encoding section 126 is a correction bit generation circuit that generates the hamming code (having 6 bits in the current example), which acts as a correction bit, from the data having the data bus width (equal to 32 bits in the current example). More specifically, when the write command is input, the ECC encoding section 126 generates the hamming code with respect to the data set DS from the data set generation section 124 and outputs the generated hamming code and the data set DS to the late write register 130 in accordance with control exercised by the RMW control circuit 112.

The late write register 130 includes an address register 132 and a data register 134.

The address register 132 is controlled by the late write control circuit 114. When the write command is input, the address register 132 outputs a stored address (late write address LRA) to the selector 140 and stores an address ADD (write address) from the address input section 120 as a new late write address LRA.

When the read command is input, the address register 132 outputs the stored late write address LRA to the ECC decoding section 160.

The data register 134 is controlled by the late write control circuit 114. When the write command is input, the data register 134 outputs stored data (late write data LRD) to the memory core 170 and stores the data set DS and hamming code from the ECC encoding section 126 as new late write data LRD. The hamming code portion and main data portion of the late write data LRD are marked "HC" and "MD", respectively.

When the read command is input, the data register 134 outputs main data MD included in the stored late write data to the ECC decoding section 160.

The selector 140 is controlled by the late write control circuit 114, and selectively outputs an address ADD (write address or read address) received from the address input section 120 and the late write address LRA received from the address register 132 to the memory core 170. More specifically, when the read command is input, the selector 140 outputs the address ADD (read address) received from the address input section 120 to the memory core 170. When the write command is input, the selector 140 outputs the address (write address) received from the address input section 120 to the memory core 170, and then outputs the late write address LRA received from the address register 132 to the memory core 170.

The memory core 170 is controlled by the late write control circuit 114. When the read command is input, the memory core 170 outputs ECC data having read data and hamming code from a memory cell corresponding to the address received from the selector 140 (the read address received from the address input section 120).

When the write command is input, the memory core 170 outputs the ECC data from a memory cell corresponding to the write address received from the selector 140 (received from the address input section 120), and then writes the late write data LRD received from the data register 134 into a memory cell corresponding to the late write address LRA received from the selector 140.

Figure 2:
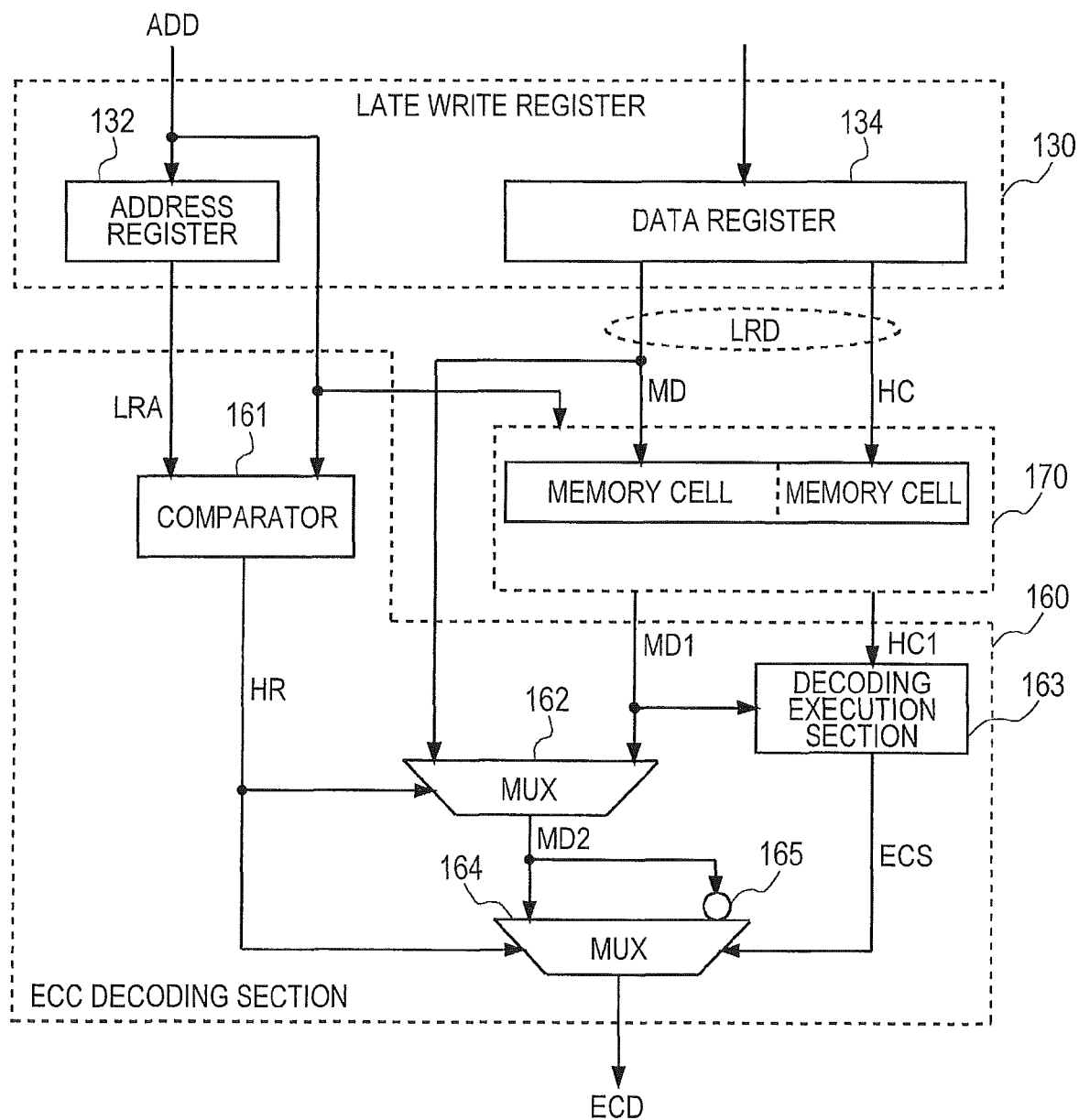
FIG. 2 is a diagram illustrating an exemplary circuit configuration of an ECC decoding section 160 in the semiconductor memory device shown in FIG. 1.

The ECC decoding section 160 is controlled by the RMW control circuit 112. FIG. 2 shows an exemplary circuit configuration of the ECC decoding section 160.

As shown in FIG. 2, the ECC decoding section 160 includes a comparator 161, a multiplexer 162, a decoding execution section 163, a multiplexer 164, and an inverter circuit 165. An operation performed by the ECC decoding section 160 when the read command is input and an operation performed by the ECC decoding section when the write command is input will now be described separately.

<When Read Command is Input>

When the read command is input, the comparator 161 compares the address ADD (read address) to the late write address LRA stored in the address register 132 of the late write register 130, and outputs a hit read signal HR indicative of the result of comparison to the multiplexer 162 and to the multiplexer 164. More specifically, if, for instance, the comparison result indicates that the read address ADD coincides with the late write address LRA, the comparator 161 outputs a hit read signal HR of "1". If, on the other hand, the comparison result does not indicate that the read address ADD coincides with the late write address LRA, the comparator 161 outputs a hit read signal HR of "0".

Further, the main data MD included in the late write data LRD stored in the data register 134 is output to the multiplexer 162.

Furthermore, the main data MD1 included in the ECC data output from the memory core 170 in accordance with the read address ADD is input to the multiplexer 162 and to the decoding execution section 163, and the hamming code HC1 included in the ECC data is input to the decoding execution section 163.

If the hit read signal HR is "1", that is, if the read address ADD coincides with the late write address LRA, the multiplexer 162 selects and outputs the main data MD received from the data register 134. If, on the other hand, the hit read signal HR is "0", that is, if the read address ADD does not coincide with the late write address LRA, the multiplexer 162 selects and outputs the main data MD1 received from the memory core 170.

The decoding execution section 163 subjects the main data MD1 and hamming code HC1 received from the memory core 170 to ECC decoding, generates an error correction signal ECS, and outputs the error correction signal ECS to the multiplexer 164.

The error correction signal ECS indicates which bit in the main data MD1 is in error.

The data output from the multiplexer 162 (either the main data MD or the main data MD1; hereinafter referred to as the main data MD2) is input to the multiplexer 164 and to the inverter circuit 165.

The inverter circuit 165 inverts all bits (32 bits) in the main data MD2 and outputs the main data MD2 having the inverted bits to the multiplexer 164.

If the hit read signal HR received from the comparator 161 is "1", the multiplexer 164 outputs the main data MD2 received from the multiplexer 162 (the main data MD received from the data register 134 in this instance) as the data ECD without waiting for the error correction signal ECS from the decoding execution section 163.

If, on the other hand, the hit read signal HR received from the comparator 161 is "0", the multiplexer 164 selects and outputs bits received from the inverter circuit 165 as bits that are included in the main data MD2 received from the multiplexer 162 (the main data MD1 received from the memory core 170 in this instance) and indicated by the error correction signal ECS, and selects and outputs bits in the main data MD2 as the other bits.

The data ECD output from the multiplexer 164 is output to the data set generation section 124 and to the data output section 150.

The data output section 150 outputs the data ECD as the read data corresponding to the read command. In other words, the ECC decoding section 160 in the semiconductor memory device 100 according to the present embodiment doubles as a read circuit for acquiring read data corresponding to the read command.

It should be noted that the data set generation section 124 operates only when the write command is input. Therefore, the data set generation section 124 does not particularly operate although the data ECD is input when the read command is input.

<When Write Command is Input>

When the write command is input, the late write data LRD generated from the data register 134 in response to the last write command is input to the memory core 170. The main data MD included in the late write data LRD is also input to the multiplexer 162.

Further, as the address ADD (write address) used this time is also input to the memory core 170, the ECC data corresponding to the write address ADD is output from the memory core 170. The main data MD1 included in the ECC data is input to the multiplexer 162 and to the decoding execution section 163, whereas the hamming code HC1 is input to the decoding execution section 163.

When the write command is input, the comparator 161 outputs a hit read signal HR of "0". Hence, the multiplexer 162 selects the main data MD1 received from the memory core 170 and outputs the selected main data MD1 to the multiplexer 164 as the main data MD2.

The decoding execution section 163 and the inverter circuit 165 operate in the same manner as in the case where the read command is input. Hence, the data ECD output from the multiplexer 164 is the main data MD1 whose error, if any, is corrected.

The data ECD output from the multiplexer 164 is supplied to the data set generation section 124.

The data set generation section 124 generates the data set DS from the write data and mask signal MASK, which are input to the semiconductor memory device 100 together with the write command, and from the data ECD received from the ECC decoding section 160. More specifically, bits that are included in the data ECD and indicated by the mask signal MASK are added by inserting them into the associated positions of the write data to generate the data set DS having the data bus width (32 bits). It should be noted that the data output section 150 does not output any data when the write command is input.

As described above, when the write command is input, the semiconductor memory device 100 according to the present embodiment performs a dummy read to read the ECC data corresponding to the write address from the memory core 170, decodes the ECC data (and corrects any error), uses the resulting data to add bits in order to compensate for the shortfall in the write data, acquires the data set DS, and generates the hamming code. Further, the semiconductor memory device 100 stores the data set DS and the hamming code in the data register 134 of the late write register 130 as the late write data LRD. Parallelly, the semiconductor memory device 100 writes into the memory core 170 the late write data LRD that was generated in response to the last write command and stored in the data register 134 of the late write register 130.

In other words, when the write command is input, the semiconductor memory device 100 exercises the RMW function to generate the data set DS and the hamming code. However, the semiconductor memory device 100 writes the generated data set DS and hamming code when the next write command is input. This type of write operation is called a late write.

When the late write is performed, the late write data LRD corresponding to the latest write data is not stored in the memory core 170, but is stored in the data register 134. Old data remains stored at an address at which the latest write data should be written.

As such being the case, when the read command is input, the semiconductor memory device 100 checks whether the read address coincides with the late write address LRA stored in the address register 132. If they coincide with each other (in the case of a hit read), the semiconductor memory device 100 outputs the main data MD included in the late write data LRD stored in the data register 134 as the read data.

Performing the above-described operation makes it possible to prevent old data from being read out of the memory core 170.

Further, when the read address coincides with the late write address LRA stored in the address register 132, the semiconductor memory device 100 outputs the main data MD included in the late write data LRD as-is as the data ECD without causing the multiplexer 164 in the ECC decoding section 160 to wait for the error correction signal ECS from the decoding execution section 163. This makes it possible to conceal the time required for the multiplexer 162 to make a selection, thereby completing a read access at the same speed as for a normal read operation.

Figure 3:
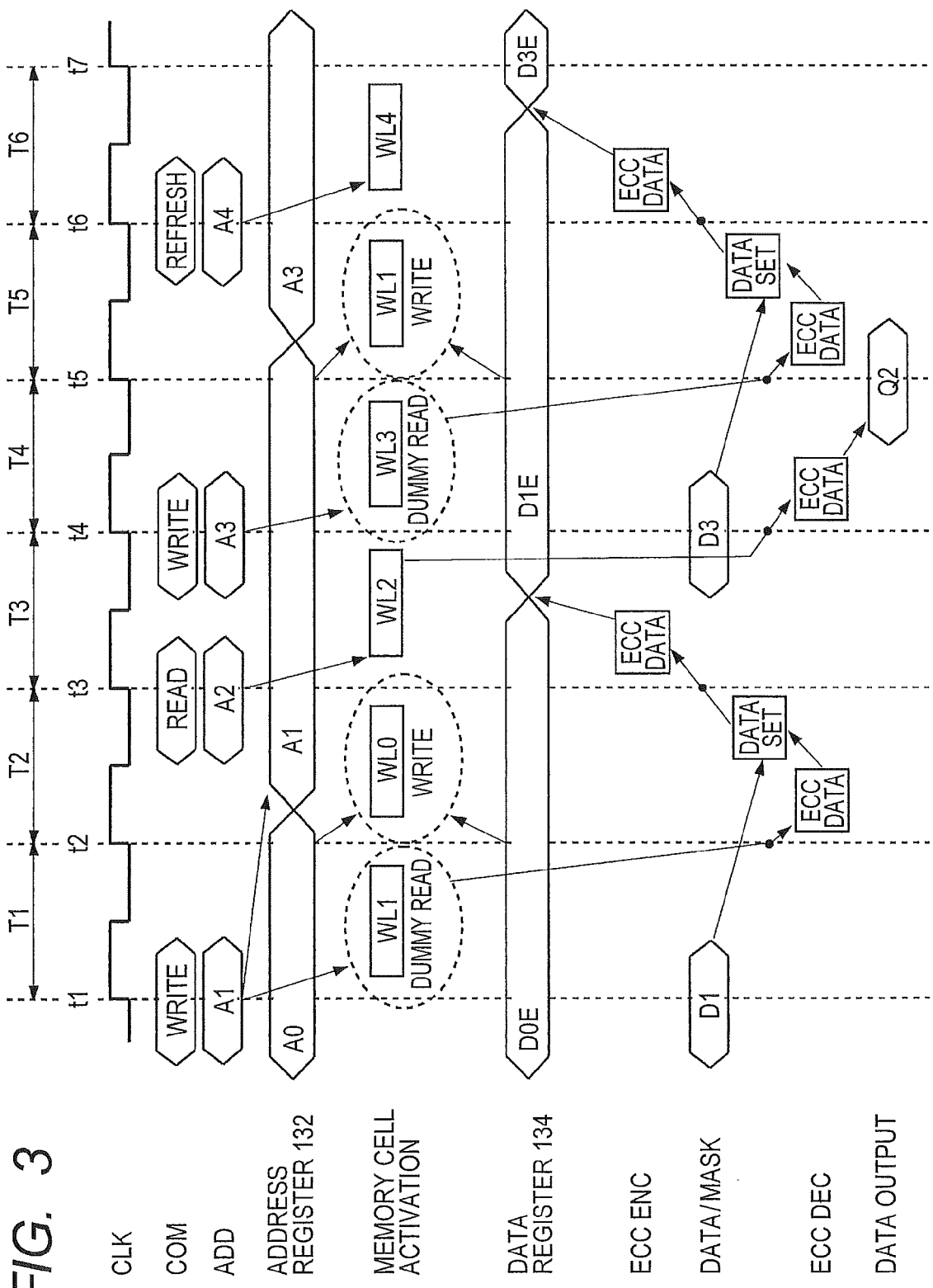
FIG. 3 is a timing diagram illustrating an exemplary flow of a process performed by the semiconductor memory device shown in FIG. 1.

FIG. 3 is a timing diagram illustrating an exemplary flow of a process performed by the semiconductor memory device 100. For ease of understanding, referring to FIG. 3, a read access will now be described with reference to a case where the read address does not coincide with the late write address LRA stored in the address register 132.

First of all, as shown in the figure, a write command "write", the write address A1, and the data signal D1 (write data and mask signal MASK) are input to the semiconductor memory device 100 at the rising edge of clock cycle T1 (at timing t1). In this instance, it is assumed that an address "A0" for the last write command is stored in the address register 132 as the late write address LRA, and that ECC data "D0E" generated in response to the last write command is stored in the data register 134 as the late write data LRD.

The semiconductor memory device 100 performs a dummy read in cycle T1. More specifically, the semiconductor memory device 100 selects a word line WL1 corresponding to the write address A1 to activate a memory cell on the word line WL1, and reads ECC data (ECC DATA in the figure) corresponding to the write address A1 from the memory core 170.

Next, in cycle T2, the semiconductor memory device 100 performs a late write. More specifically, the semiconductor memory device 100 selects a word line WL0 corresponding to the late write address LRA (A0) stored in the address register 132 to activate a memory cell on the word line WL0, and writes the late write data LRD (D0E) stored in the data register 134 into the memory core 170. Further, the semiconductor memory device 100 stores an address "A1" in the address register 132 as a new late write address LRA.

Parallelly, the semiconductor memory device 100 not only subjects the ECC data read in cycle T1 to ECC decoding (and error correction as well), but also creates a data set having the same bit width as the data bus width from the ECC-decoded data and the data signal D1 (write data/mask signal MASK) input at timing t1.

Next, in cycle T3, the semiconductor memory device 100 acquires ECC data by subjecting the data set generated in cycle T2 to ECC encoding, and stores the acquired ECC data in the data register 134 as new late write data LRD.

In cycle T3, the semiconductor memory device 100 performs ECC encoding, but does not write the ECC data derived from ECC encoding into the memory core 170. Therefore, the memory core 170 can be accessed for a read operation.

As indicated by the example shown in FIG. 3, the read command (READ) and the read address A2 are input at the rising edge of cycle T3 (at timing t3).

Hence, in cycle T3, in parallel with ECC encoding, the semiconductor memory device 100 selects a word line WL2 corresponding to the read address A2 to activate a memory cell on the word line WL2, and reads ECC data corresponding to the write address A2.

Next, in cycle T4, the semiconductor memory device 100 subjects the ECC data read in cycle T3 to ECC decoding to acquire read data Q2 having the same number of bits as the data bus width. Then, at the rising edge of the next cycle (at timing t5), the semiconductor memory device 100 outputs the acquired read data Q2.

Further, at the rising edge of cycle T4 (at timing t4), the write command "write", a write address A3, a data signal D3 (write data and mask signal MASK) are input to the semiconductor memory device 100. In this instance, "A1" is stored in the address register 132 as the late write address LRA, and "D1E" is stored in the data register 134 as the late write data LRD.

The semiconductor memory device 100 performs a dummy read in cycle T4. More specifically, the semiconductor memory device 100 selects a word line WL3 corresponding to the write address A3 to activate a memory cell on the word line WL3, and reads ECC data corresponding to the write address A3 from the memory core 170.

Next, in cycle T5, the semiconductor memory device 100 performs a late write. More specifically, semiconductor memory device 100 selects the word line WL1 corresponding to the late write address LRA (A1) stored in the address register 132 to activate a memory cell on the word line WL1, and writes the late write data LRD (D1E) stored in the data register 134 into the memory core 170. The semiconductor memory device 100 stores an address "A3" in the address register 132 as a new late write address LRA.

Parallelly, the semiconductor memory device 100 not only subjects the ECC data read in cycle T4 to ECC decoding (and error correction as well), but also creates a data set having the same bit width as the data bus width from the ECC-decoded data and the data signal D3 (write data/mask signal MASK) input at timing t4.

Next, in cycle T6, the semiconductor memory device 100 acquires ECC data by subjecting the data set generated in cycle T5 to ECC encoding, and stores the acquired ECC data in the data register 134 as new late write data LRD.

In cycle T6, the semiconductor memory device 100 performs ECC encoding, but does not write the ECC data derived from ECC encoding into the memory core 170. Therefore, the memory core 170 can be accessed for a read operation and refreshed.

Refresh is a process performed at fixed time intervals to inject an electric charge into a memory (e.g., a DRAM) that retains information by storing an electric charge in a capacitor and lets the stored electric charge decrease with time. The refresh process is usually performed on each word line.

As an example, it is assumed that the semiconductor memory device 100 according to the present embodiment performs a refresh in response to a refresh command from the outside. In the example shown in FIG. 3, the refresh command (REFRESH in the figure) and an address (refresh address) A4 indicative of a memory cell to be refreshed are input at timing t6.

In cycle T6, the semiconductor memory device 100 performs the refresh process in compliance with the refresh command. More specifically, the semiconductor memory device 100 selects a word line WL4 corresponding to the refresh address A4, reads data stored in a memory cell on the word line WL4, amplifies the data, and writes the amplified data back into the memory cell.

Figure 9:
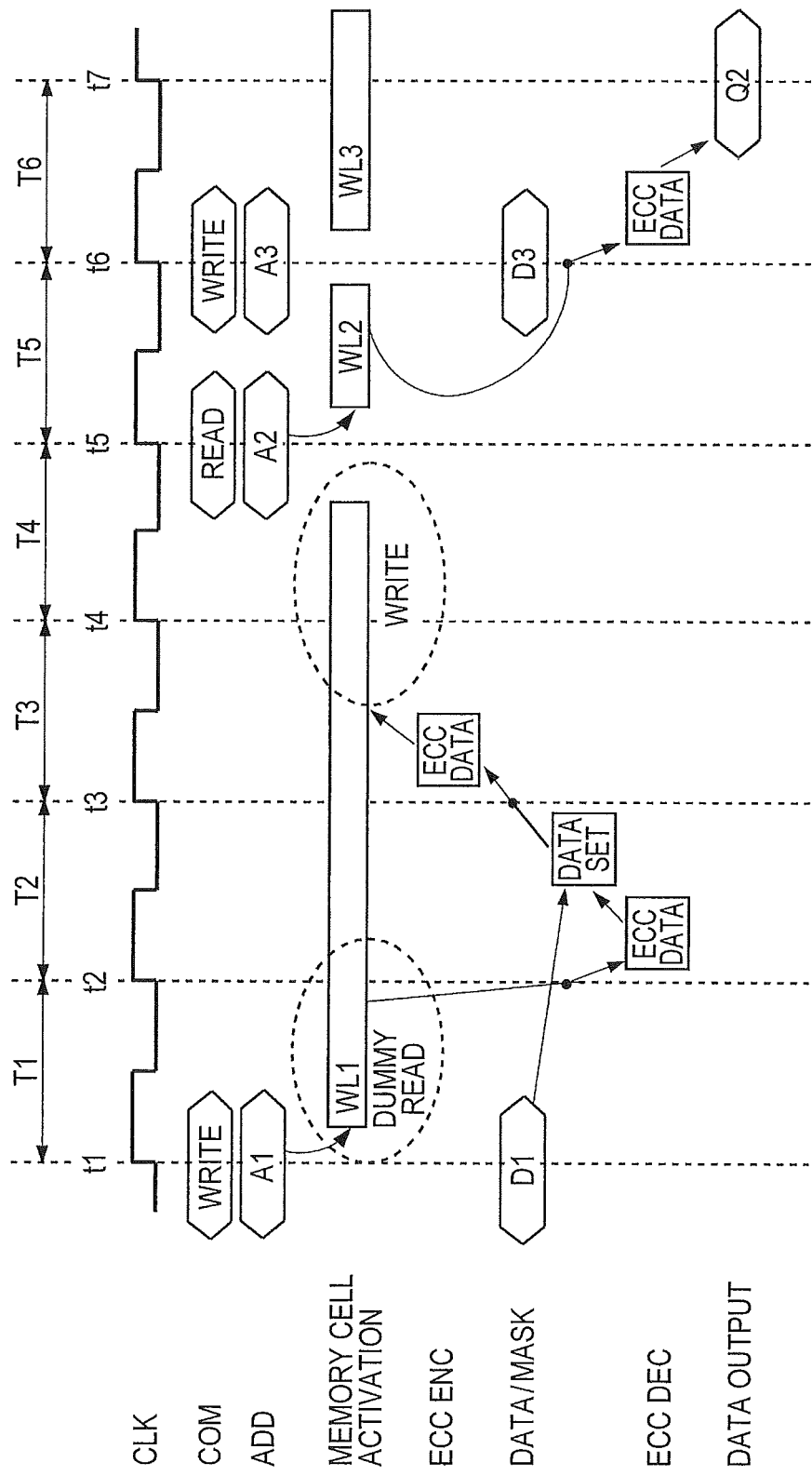
FIG. 9 is a timing diagram illustrating an exemplary flow of a process performed by a memory having the RMW function.

As indicated in FIG. 3, the semiconductor memory device 100 completes one write operation in two cycles (in cycles T1 to T2 or cycles T2 to T3). As is obvious from the comparison between FIG. 3 and FIG. 9, the speed of write access provided by the semiconductor memory device 100 is two times the speed of write access provided by a related-art memory having the RMW function.

Second Embodiment

A second embodiment of the present invention will now be described. The semiconductor memory device 100 according to the first embodiment uses one cycle to decode ECC data read by a dummy read operation and generate a data set and, uses another cycle to subject the data set to ECC encoding. Therefore, ECC data corresponding to an input write command is stored in the late write register 130 in the third cycle from the input of the write command.

Alternatively, however, the semiconductor memory device having a relatively long clock CLK cycle can complete the decoding of ECC data read by a dummy read operation, the generation of a data set, and ECC encoding in one cycle. In this instance, the ECC data corresponding to the write command can be stored in the late write register 130 in the second cycle from the input of the write command.

When the above-described scheme is used, one clock CLK cycle can be fully utilized. In addition, the number of clock synchronization flip-flops (not shown) included in the control section 110 can be reduced. This makes it possible to reduce the circuit scale and power consumption of the semiconductor memory device.

Third Embodiment

A third embodiment of the present invention will now be described. The semiconductor memory device 100 according to the first embodiment starts a dummy read operation compliant with the write command and a write (late write) of the late write data LRD stored in the late write register 130 into the memory core 170 in synchronism with a clock CLK edge of the respective cycle.

However, the late write need not always be started in synchronism with a clock CLK edge. Alternatively, the late write can be started immediately after the completion of a dummy read due, for instance, to internal delay.

When, for instance, the memory core of a DRAM is used, the time required for a write into the memory core is generally longer than the time required for a read from the memory core. When the late write is started as an operation immediately succeeding a dummy read, the time within a cycle for the dummy read can be partly used for the late write. As a result, the limit on a write margin with respect to the frequency of the clock CLK can be eased. This makes it possible to use a high-speed clock CLK.

Further, when the clock CLK has a relatively long cycle, the dummy read and the late write can be performed in one cycle. Effectively, a write operation can be completed in one cycle. In this instance, when viewed from the outside, the specifications are the same as in the case where the error correction function is not incorporated.

Fourth Embodiment

A fourth embodiment of the present invention will now be described. The semiconductor memory device 100 according to the first embodiment inputs the write command and the write data/mask signal MASK at the same timing.

However, as is obvious from FIG. 3, the data signal D1 (write data/mask signal MASK), which is input simultaneously with the write command at the rising edge t1 of cycle T1, is used when a data set is generated, that is, in the second cycle from the input of the write command (in cycle T2). Therefore, the input of the data signal D (write data/mask signal MASK) can be can be delayed by one cycle with respect to the input of the write command.

Even when the write command is input in a cycle immediately after a read command input cycle, the use of the above delay scheme makes it possible to ensure that the read data output to the outside from the semiconductor memory device in response to the read command does not conflict with the write data/mask signal MASK related to the write command. Thus, a data I/O (input/output) portion (e.g., external bus) of the semiconductor memory device can be commonly used for a read and for a write. As a result, the number of data signal lines can be reduced to half.

Fifth Embodiment

A fifth embodiment of the present invention will now be described. The late write technology incorporated in the semiconductor memory device 100 according to the first embodiment is also applicable to a case where the data input/output relative to the semiconductor memory device is in burst mode. The fifth embodiment will be described with reference to the timing diagram of FIG. 4. For the sake of simplicity, the functional blocks of the semiconductor memory device 100 are used to explain about the timing diagram of FIG. 4.

Figure 4:
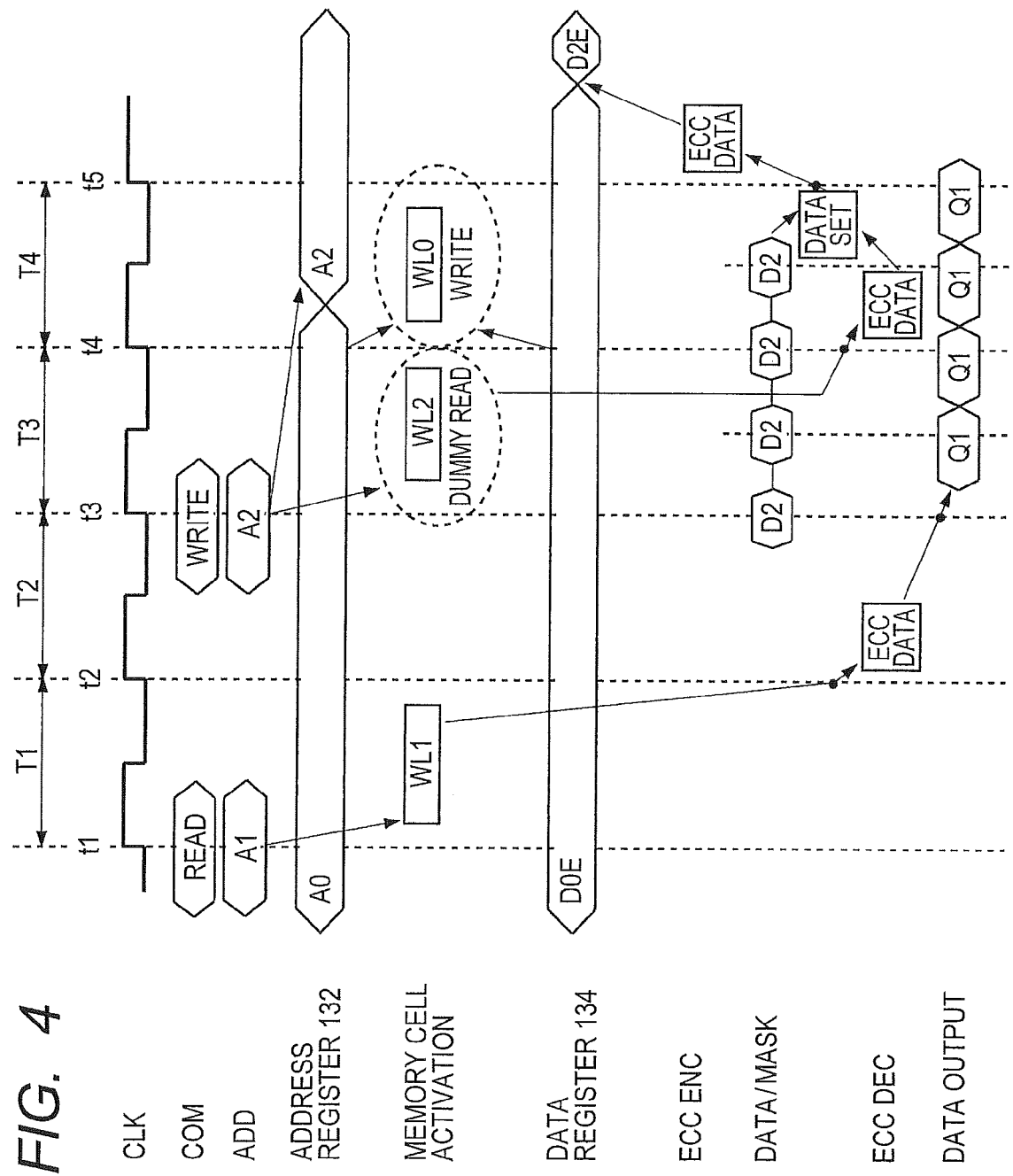
FIG. 4 is a timing diagram illustrating an exemplary flow of a process performed by the semiconductor memory device according to a fifth embodiment of the present invention.

FIG. 4 shows an exemplary burst mode in which DDR (Double Data Rate) is used to input/output 8 bits of data four times in succession. It is assumed that 4 bits are masked each time a write is performed.

At the rising edge of cycle T1 (at timing t1), a read command and a read address A1 are input. In this instance, it is assumed that a late write address LRA (A0) is stored in the address register 132, and that late write data LRD (D0E) is stored in the data register 134.

In cycle T1, the semiconductor memory device according to the fifth embodiment selects a word line WL1 corresponding to the read address A1 to activate a memory cell on the word line WL1, and reads ECC data corresponding to the read address A1.

Next, in cycle T2, the semiconductor memory device according to the fifth embodiment acquires 32-bit read data Q1 by subjecting the ECC data read in cycle T1 to ECC decoding.

Next, in cycles T3 to T4, the semiconductor memory device according to the fifth embodiment outputs 8 bits of the read data Q1 four times in succession.

Further, at the rising edge of cycle T3 (at timing t3), the semiconductor memory device according to the fifth embodiment inputs the write command "write" and the write address A2. A data signal D2 (write data and mask signal MASK) is input in four parts in cycles T3 to T4.

The semiconductor memory device according to the fifth embodiment performs a dummy read in cycle T3. More specifically, the semiconductor memory device selects a word line WL2 corresponding to the write address A2 to activate a memory cell on the word line WL2, and reads ECC data corresponding to the write address A2 from the memory core 170.

Next, in cycle T4, the semiconductor memory device according to the fifth embodiment performs a late write. More specifically, the semiconductor memory device selects a word line WL0 corresponding to the late write address LRA (A0) stored in the address register 132 to activate a memory cell on the word line WL0, and writes the late write data LRD (D0E) stored in the data register 134 into the memory core 170. The semiconductor memory device stores an address "A2" in the address register 132 as a new late write address LRA.

Parallelly, the semiconductor memory device according to the fifth embodiment not only subjects the ECC data read in cycle T3 to ECC decoding (and error correction as well), but also creates a 32-bit data set from the ECC-decoded data and the data signal D2 (write data/mask signal MASK) input at timing t3.

Next, in a cycle subsequent to cycle T4, the semiconductor memory device according to the fifth embodiment acquires ECC data (D2E) by subjecting the data set generated in cycle T4 to ECC encoding, and stores the ECC data in the data register 134 as new late write data LRD.

When a semiconductor memory device having the ECC function and the RMW function is designed to input/output data in burst mode, the semiconductor memory device generates a data set after the write data is entirely received, generates ECC data, and writes the generated ECC data into the memory core in order to generate a data set after the input of the write command.

A technology for performing a write operation at high speed in a semiconductor memory device having the ECC function and the RMW function and designed to input and output data in burst mode is disclosed in Japanese Unexamined Patent Publication No. 2005-327437. When a new write command is input as described above, this technology not only creates a data set, that is, ECC data, from write data of the last write command, which is stored in a register, and writes the data set into the memory core, but also stores write data of the new write command in the register. In other words, this technology generates a data set, that is, ECC data, from the write data of the last write command and writes the generated ECC data into the memory core during a wait period before the new write data is entirely received.

Meanwhile, the semiconductor memory device according to the fifth embodiment writes ECC data generated in response to the last write command into the memory core during a wait period before the new write data is entirely received. After the new write data is entirely received, the semiconductor memory device according to the fifth embodiment generates a data set, that is, ECC data, but does not perform a write into the memory core. Therefore, the semiconductor memory device according to the fifth embodiment can perform a write operation at high speed, as is the case with the technology disclosed in Japanese Unexamined Patent Publication No. 2005-327437.

Sixth Embodiment

An exemplary case where the refresh process is performed in compliance with a refresh command input from the outside was described earlier in conjunction with the semiconductor memory device 100 according to the first embodiment. The above-described late write function is also applicable to a semiconductor memory device that exercises a hidden-refresh function. A sixth embodiment of the present invention will now be described with reference to the hidden-refresh function.

The hidden-refresh function is exercised to autonomously perform a refresh in a DRAM or other memory at predetermined time intervals (normally at intervals of a plurality of cycles). A semiconductor memory device having the hidden-refresh function does not have to exercise control over the input of a refresh command from the outside, that is, over a refresh.

Figure 5:
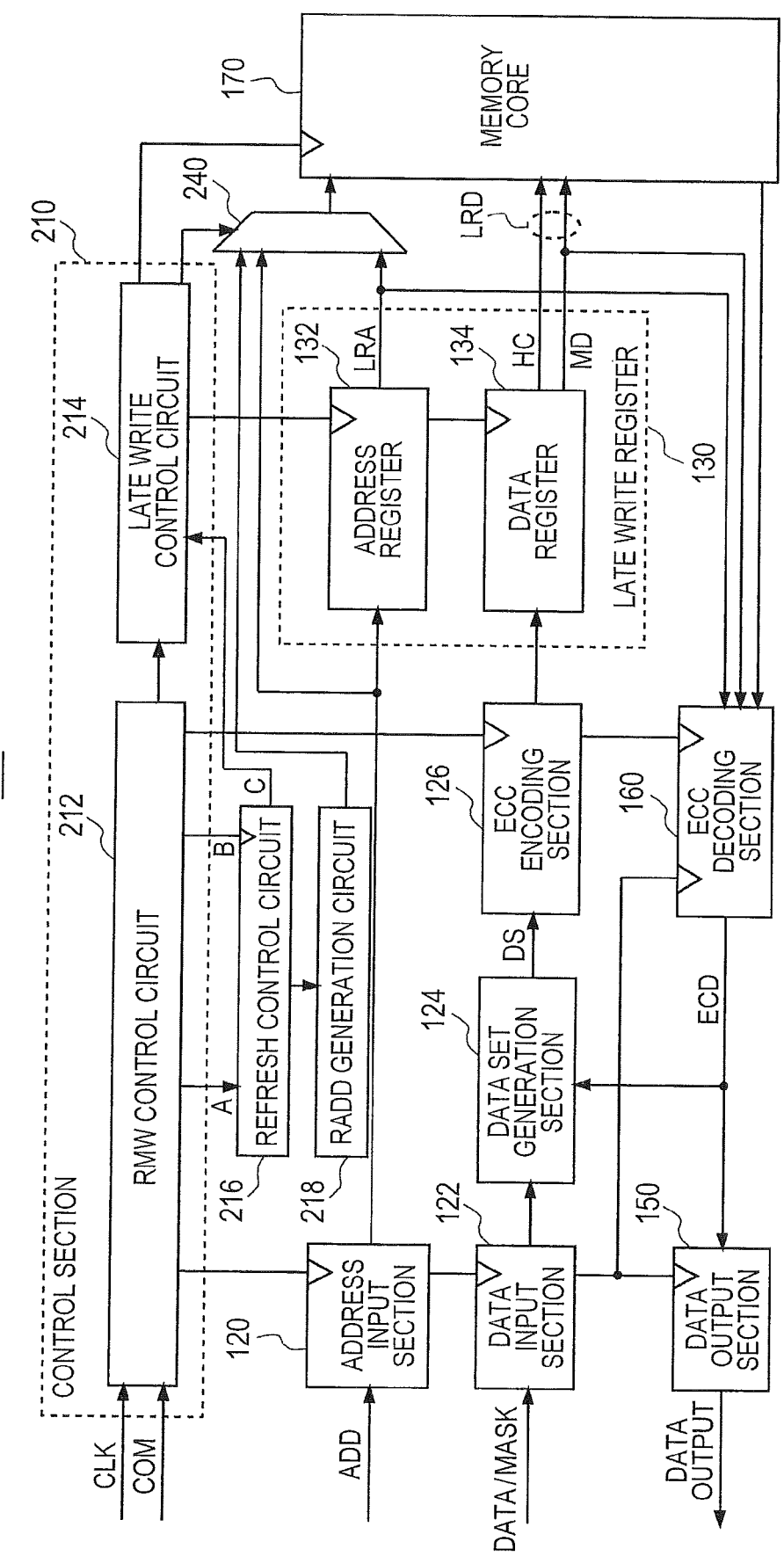
FIG. 5 is a diagram illustrating the semiconductor memory device according to a sixth embodiment of the present invention.

FIG. 5 shows a semiconductor memory device 200 according to the sixth embodiment. The semiconductor memory device 200 is similar to the semiconductor memory device 100 shown in FIG. 1 except that the former additionally includes a refresh control circuit 216 and an RADD (refresh address) generation circuit 218 and includes a control section 210 and a selector 240 in place of the control section 110 and the selector 140. Hence, the semiconductor memory device 200 will be described with reference to its differences from the semiconductor memory device 100.

The control section 210 includes an RMW control circuit 212 and a late write control circuit 214. The RMW control circuit 212 has a function of outputting a first signal A and a second signal B to the refresh control circuit 216 in addition to the functions of the RMW control circuit 112 in the control section 110 of the semiconductor memory device 100.

The first signal A is command information for determining whether or not to perform a refresh. For example, each time a command CMD is input from the outside, the control section 210 outputs information indicative of the command to the refresh control circuit 216 as the first signal A.

The second signal B is an internal clock signal for refresh control. In accordance with the first signal A and the second signal B, which are generated from the RMW control circuit 212, the refresh control circuit 216 determines whether or not to perform a refresh. More specifically, in accordance with the time of data retention in a memory cell, the refresh control circuit 216 determines, for example, to perform a refresh at intervals of a plurality of cycles and immediately after a read operation (a read access and a dummy read from the outside) with respect to the memory core 170.

The refresh control circuit 216 determines to perform a refresh immediately after a read operation with respect to the memory core 170 for the purpose of ensuring that the refresh address does not conflict with an extraneous read/write address.

When the refresh control circuit 216 determines to perform a refresh, it not only outputs a control signal for generating the refresh address (RADD) to the RADD generation circuit 218, but also outputs a third signal C to the late write control circuit 214. The third signal C is a control signal that causes the late write control circuit 214 to activate a refresh.

Upon each receipt of a control signal indicative of refresh address generation from the refresh control circuit 216, the RADD generation circuit 218 generates a refresh address RADD (the address to be refreshed), and outputs the generated refresh address to the selector 240.

As the refresh is sequentially performed for each word line with respect to the memory core, the RADD generation circuit 218 increments by one word line from the last refresh address and then generates a new refresh address.

Upon receipt of the third signal C from the refresh control circuit 216, the late write control circuit 214 not only outputs a control signal for performing a refresh to the memory core 170, but also outputs a control signal to the selector 240 to have the selector 240 select an address (refresh address) from the RADD generation circuit 218.

The selector 240 selects a refresh address from the RADD generation circuit 218, an address ADD from the address input section 120, or a late write address LRA from the address register 132, and outputs the selected address to the memory core 170. More specifically, when the control signal from the late write control circuit 214 indicates the selection of the refresh address, the selector 240 selects the refresh address from the RADD generation circuit 218. When the read command and the write command are input to the semiconductor memory device 200, the selector 240 selects either the address ADD from the address input section 120 or the late write address LRA from the address register 132, as is the case with the selector 140 in the semiconductor memory device 100.

Upon receipt of a control signal indicative of the execution of a refresh from the late write control circuit 214, the memory core 170 selects a word line corresponding to the refresh address from the selector 240 and refreshes a memory cell on the selected word line. This refresh operation will not be described in detail because it is the same as the refresh operation performed when the refresh command is input from the outside.

Figure 6:
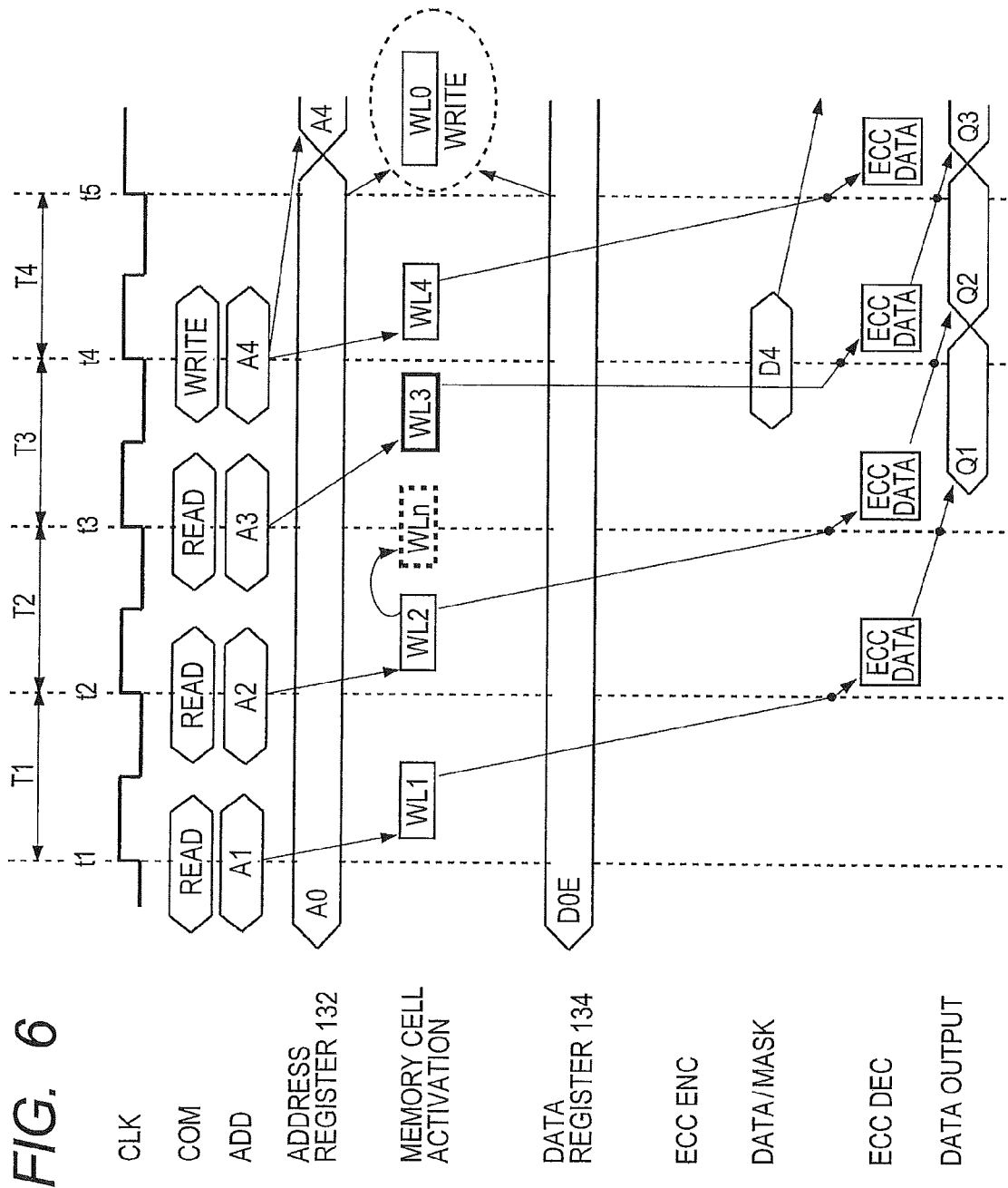
FIG. 6 is a timing diagram illustrating an exemplary flow of a process performed by the semiconductor memory device shown in FIG. 5.

FIG. 6 is a timing diagram illustrating an exemplary flow of a process performed by the semiconductor memory device 200. In FIG. 6, a word line indicated by a dotted outline is connected to a memory cell activated for a refresh operation.

The read command and the read address A1 are input at the rising edge of cycle T1 (at timing t1). In this instance, it is assumed that the late write address LRA (A0) is stored in the address register 132, and that the late write data LRD (D0E) is stored in the data register 134.

In cycle T1, the semiconductor memory device 200 selects a word line WL1 corresponding to the read address A1 to activate a memory cell on the word line WL1, and reads ECC data corresponding to the read address A1.

Next, in cycle T2, the semiconductor memory device 200 subjects the ECC data read in cycle T1 to ECC decoding to acquire 32-bit read data Q1.

Next, in cycle T3, the semiconductor memory device 200 outputs the read data Q1 to the outside.

Further, at the rising edge of cycle T2 (at timing t2), the read command and the read address A2 are input.

In cycle T2, the semiconductor memory device 200 selects a word line WL2 corresponding to the read address A2 to activate a memory cell on the word line WL2, and reads ECC data corresponding to the read address A2.

Next, in cycle T3, the semiconductor memory device 200 subjects the ECC data read in cycle T2 to ECC decoding to acquire 32-bit read data Q2.

Next, in cycle T4, the semiconductor memory device 200 outputs the read data Q2 to the outside.

When a read operation relative to the read address A2 is completed in cycle T2, the memory cell on a word line WLn is refreshed. In the present embodiment, a refresh is not performed in synchronism with the clock CLK, but is performed subsequently to a read operation due, for instance, to an internal delay. Therefore, the memory cell on the word line WLn is refreshed in cycles T2 to T3 and is completely refreshed in the first half of cycle T3 at the latest.

At the rising edge of cycle T3 (at timing t3), the read command and the read address A3 are input.

In the present embodiment, the semiconductor memory device 200 delays the start of a read in a cycle subsequent to a cycle in which a refresh is started (cycle T2 in the current example) by a predefined period of time so that the read in the subsequent cycle starts immediately after completion of the refresh. The predefined period of time is determined in accordance with time required for the refresh.

As such being the case, a read into the memory core 170 corresponding to the read address A3 can be performed in cycle T3 although the refresh of the memory cell on the word line WLn is completed in cycle T3.

As shown in FIG. 6, in cycle T3, the semiconductor memory device 200 selects a word line WL3 (indicated by a thick solid outline in the figure) corresponding to the read address A3 after completion of the refresh to activate a memory cell on the word line WL3, and reads ECC data corresponding to the read address A3.

Hence, in cycle T4, the semiconductor memory device 200 subjects the ECC data read in cycle T3 to ECC decoding to acquire a 32-bit read data Q3. The read data Q3 is output to the outside in a cycle subsequent to cycle T4.

It should be noted that the write command "write", a write address A4, and a data signal D4 (write data and mask signal MASK) are input at the rising edge of cycle T4 (at timing t4).

The semiconductor memory device 200 performs a dummy read in cycle T4. In the next cycle, the semiconductor memory device 200 writes the late write data LRD (D0E) at the late write address LRA (A0) stored in the late write register 130. Parallelly, the semiconductor memory device 200 performs, for example, a process of decoding ECC data read by the dummy read performed in cycle T4 and a process of generating a data set. These processes are not described in detail here because they have already been described.

Figure 7:
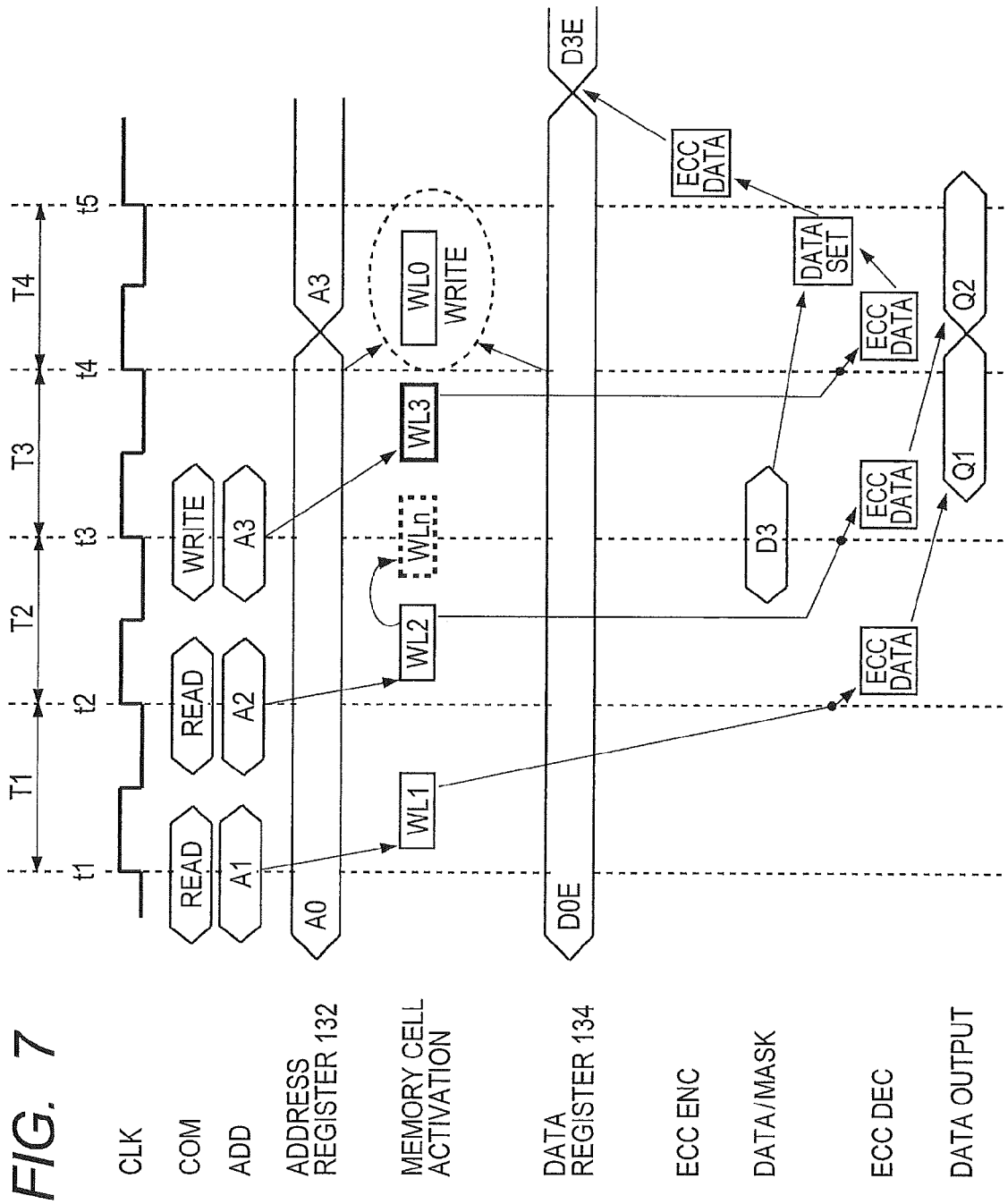
FIG. 7 is a timing diagram illustrating another exemplary flow of a process performed by the semiconductor memory device shown in FIG. 5.

FIG. 7 shows another exemplary flow of a process performed by the semiconductor memory device 200. In this example, a refresh is performed after the input of the write command.

As shown in FIG. 7, the semiconductor memory device 200 performs the same process as shown in FIG. 6 before the start of a refresh operation.

At the rising edge of cycle T3 (at timing t3), the write command, the write address (A3), and the data signal D3 (write data/mask signal MASK) are input.

The semiconductor memory device 200 performs a dummy read in cycle T3. However, the start of the dummy read is delayed so that the dummy read starts after completion of the refresh. As shown in FIG. 7, the selection of the word line WL3 for the dummy read is made after the refresh of the memory cell on a word line WLn is completed.

Subsequently, in cycle T4, the semiconductor memory device 200 subjects the ECC data read by the dummy read in cycle T3 to ECC decoding, generates a data set, and performs a late write operation for the late write data LRD (D0E) stored in the register 130. The description of the subsequent process is also omitted.

FIGS. 6 and 7 show cases where a refresh is performed after a read operation is performed in compliance with the read command. Referring to FIG. 6, when, for instance, the refresh is not performed in cycle T3 but is performed after the dummy read in cycle T4 (a read operation performed with respect to the address A4), and a new read command is input at timing t5, the semiconductor memory device 200 delays the start of a read operation relative to the new read command by a predefined period of time in a cycle initiated at timing t5.

As described above, the semiconductor memory device 200 according to the present embodiment does not start a refresh operation in synchronism with the clock CLK. Instead, the semiconductor memory device 200 starts the refresh operation after the read operation compliant with the read command and the read operation provided by the dummy read are completed. Further, the semiconductor memory device 200 delays, by a predefined period of time, the start of a read operation to be performed in a cycle subsequent to a cycle in which the refresh is started (the start of the read operation compliant with the read command or the read operation provided by the dummy read). Consequently, the memory core 170 can be accessed three times during two cycles in which the refresh is performed. The start of a read operation subsequent to the refresh need not be delayed to a cycle subsequent to a cycle in which the refresh is completed.

Seventh Embodiment

A seventh embodiment of the present invention will now be described. The seventh embodiment also relates to a semiconductor memory device. The semiconductor memory device according to the seventh embodiment also exercises the hidden-refresh function and is applicable to a case where data is input and output in burst mode. As the data input/output is in burst mode, the semiconductor memory device according to the present embodiment does not delay the start of a read operation subsequent to a refresh, but delays the start of a late write subsequent to the refresh. In the other respects, the semiconductor memory device according to the present embodiment is the same as the semiconductor memory device 200 according to the sixth embodiment.

Figure 8:
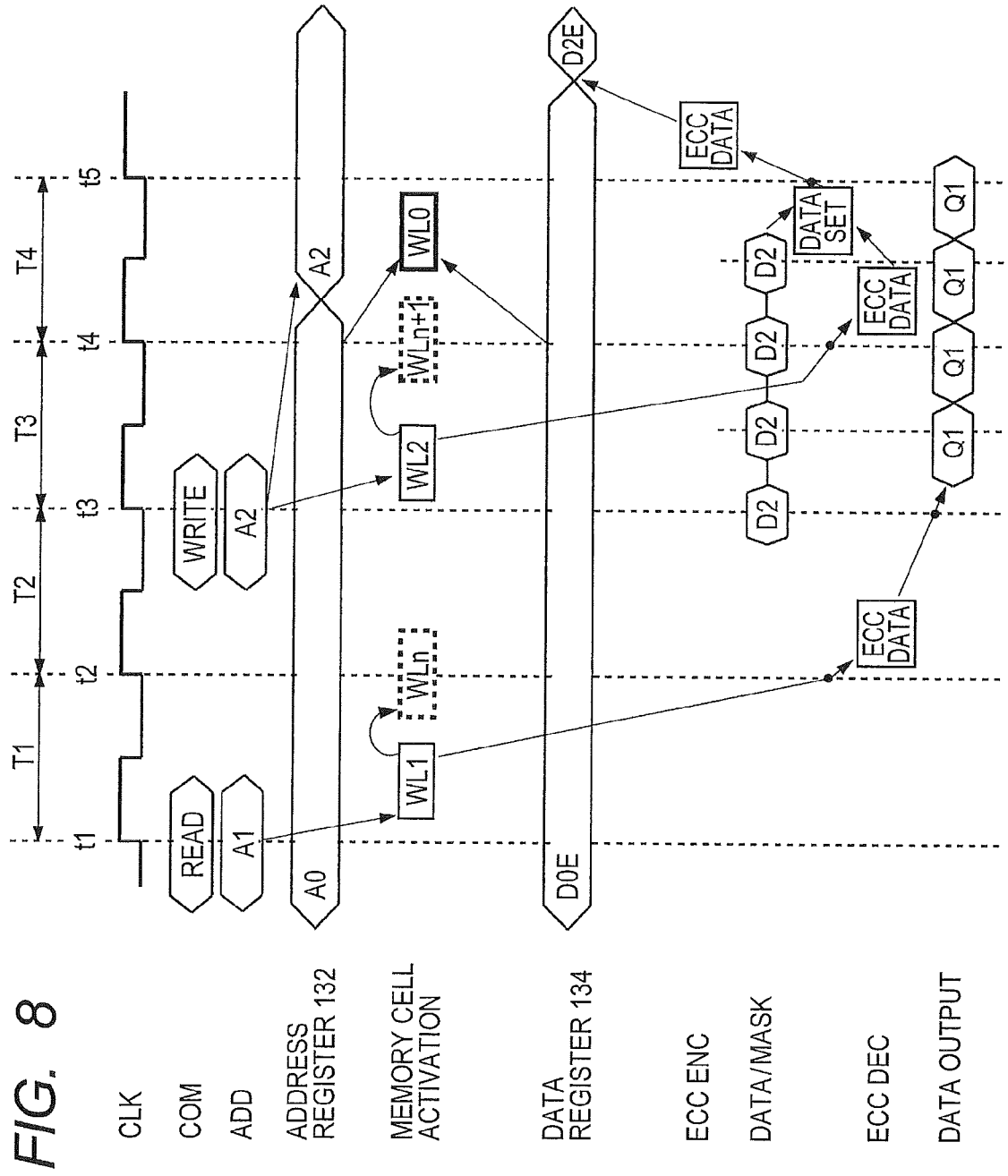
FIG. 8 is a timing diagram illustrating an exemplary flow of a process performed by the semiconductor memory device according to a seventh embodiment of the present invention.

FIG. 8 is a timing diagram illustrating an exemplary flow of a process performed by the semiconductor memory device according to the present embodiment. As the burst mode is employed, DDR (Double Data Rate) is used in the example shown in the figure to input/output 8 bits of data four times in succession. Each time a write is performed, 4 bits are masked. In FIG. 8, a word line indicated by a dotted outline is connected to a memory cell activated for a refresh operation, and a word line indicated by a thick solid outline is connected to a memory cell that is activated for a late write the start of which is delayed.

At the rising edge of cycle T1 (at timing t1), the read command and the read address A1 are input. In this instance, it is assumed that the late write address LRA (A0) is stored in the address register 132, and that the late write data LRD (D0E) is stored in the data register 134.

In cycle T1, the semiconductor memory device according to the present embodiment selects a word line WL1 corresponding to the read address A1 to activate a memory cell on the word line WL1, and reads ECC data corresponding to the read address A1.

When the read operation relative to the read address A1 is completed, the memory cell on a word line WLn is refreshed. As is the case with the semiconductor memory device 200, the semiconductor memory device according to the present embodiment does not perform the refresh in synchronism with the clock CLK, but performs the refresh subsequently to a read operation due, for instance, to an internal delay.

In cycle T2, the semiconductor memory device according to the present embodiment subjects the ECC data read in cycle T1 to ECC decoding to acquire 32-bit read data Q1.

Next, in cycles T3 to T4, the semiconductor memory device according to the present embodiment outputs 8 bits of the read data Q1 four times in succession.

Further, at the rising edge of cycle T3 (at timing t3), the semiconductor memory device according to the present embodiment inputs the write command "write" and the write address A2. The data signal D2 (write data and mask signal MASK) is input in four parts in cycles T3 to T4.

The semiconductor memory device according to the present embodiment performs a dummy read in cycle T3. More specifically, the semiconductor memory device selects a word line WL2 corresponding to the write address A2 to activate a memory cell on the word line WL2, and reads ECC data corresponding to the write address A2 from the memory core 170.

When the read operation (dummy read) relative to the word line WL2 is completed in cycle T3, the memory cell on a word line (WLn+1) is refreshed. As mentioned earlier, this refresh is not performed in synchronism with the clock CLK, but is performed subsequently to the dummy read.

In cycle T4, the semiconductor memory device according to the present embodiment performs a late write. More specifically, the semiconductor memory device selects a word line WL0 corresponding to the late write address LRA (A0) stored in the address register 132 to activate a memory cell on the word line WL0, and writes the late write data LRD (D0E) stored in the data register 134 into the memory core 170. The semiconductor memory device stores an address "A2" in the address register 132 as a new late write address LRA.

Parallelly, the semiconductor memory device according to the present embodiment not only subjects the ECC data read in cycle T3 to ECC decoding (and error correction as well), but also creates a 32-bit data set from the ECC-decoded data and the data signal D2 (write data/mask signal MASK) input at timing t3.

Next, in a cycle subsequent to cycle T4, the semiconductor memory device according to the present embodiment acquires ECC data (D2E) by subjecting the data set generated in cycle T4 to ECC encoding, and stores the ECC data in the data register 134 as new late write data LRD.

As is obvious from FIG. 8, the current example indicates that the memory core 170 is accessed up to three times (for one dummy read, one refresh, and one late write) during an interval between the input of the write command and the completion of a write operation). Therefore, if the frequency of the clock CLK is 200 MHz, the operating frequency of the memory core 170 needs to be 300 MHz or higher.

In the second cycle from the input of the write command, a late write is performed to write the late write data LRD into the memory core 170, and the memory cell on the word line (WLn+1) is refreshed before the late write. Therefore, control needs to be exercised so that the start of the late write in the second cycle (the write into the memory cell on the word line WL0 in cycle T4 shown in FIG. 8) is delayed from the rising edge of cycle T4 (timing t4).

When the frequency of the clock CLK is 200 MHz and the operating frequency of the memory core 170 is 300 MHz, the start of the late write in cycle T4 should be delayed approximately 1.65 ns, which is equivalent to half a cycle of the memory core 170, from timing t4 in consideration of the fact that the refresh of the memory cell on the word line (WLn+1) is started in cycle T3.

As described above, the semiconductor memory device according to the present embodiment, which inputs data in burst mode, does not start a refresh in synchronism with the clock CLK, but starts the refresh after completion of a read operation compliant with the read command and a read operation provided by a dummy read. In addition, the semiconductor memory device according to the present embodiment delays, by a predefined period of time, the start of a late write that is to be performed in a cycle subsequent to a cycle in which the refresh is started. This ensures that the memory core 170 can be accessed three times during two cycles in which the refresh is performed. Consequently, the start of a late write operation after the refresh need not be delayed to a cycle subsequent to a cycle in which the refresh is completed.

While the present invention contemplated by its inventors has been described in detail in terms of preferred embodiments, it is to be understood that the present invention is not limited to those preferred embodiments, but extends to various modifications that nevertheless fall within the spirit and scope of the appended claims.

What is claimed is:

1. A semiconductor memory device comprising:
   a memory core;
   a correction bit generation circuit that generates a correction bit from data having a predetermined bit width;
   a data set generation section;
   a late write register that temporarily stores a late write address and late write data; and
   a control section that exercises control in compliance with a write command for write data having a bit width less than the predetermined bit width in order to perform a dummy read operation, a data set generation process, a correction bit generation process, a late write operation, and a late write data storage process;
   wherein the dummy read operation is performed to output data corresponding to a write address of the write command from the memory core;
   wherein the data set generation process is performed by the data set generation section to generate a data set having the predetermined bit width by using the data output from the memory core during the dummy read operation to add bits in order to compensate for the shortfall in the write data;
   wherein the correction bit generation process is performed by the correction bit generation circuit to generate the correction bit from the data set;
   wherein the late write operation is performed in parallel with the generation of the data set and of the correction bit to write the late write data stored in the late write register into a memory cell of the memory core that corresponds to the late write address; and
   wherein the late write data storage process is performed to handle the write address as a new late write address and store the data set and the correction bit into the late write register as new late write data.

2. The semiconductor memory device according to claim 1, further comprising:
   a read circuit that compares a read address to the late write address stored in the late write register when a read command is input;
   wherein, if the read address coincides with the late write address, the read circuit outputs the data set included in the late write data stored in the late write register; and
   wherein, if the read address does not coincide with the late write address, the read circuit not only reads data with the correction bit from the read address in the memory core, but also performs an error correction process on the read data in accordance with the correction bit and outputs the error-corrected data.

3. The semiconductor memory device according to claim 1, wherein the write command is input in synchronism with a clock; and wherein the control section exercises control so that the dummy read is performed in synchronism with the clock, and that the late write is not performed in synchronism with the clock but is performed subsequently to the dummy read.

4. The semiconductor memory device according to claim 1, wherein the write command is input in synchronism with the clock; and wherein the write data of the write command is input one cycle later than the write command in synchronism with the clock.

5. The semiconductor memory device according to claim 1, further comprising:
- a refresh control section that exercises control so that the memory core is refreshed at intervals of a plurality of cycles of a clock;
- wherein the read command and the write command are input in synchronism with the clock;
- wherein the refresh control section exercises control so that the refresh is not performed in synchronism with the clock but is performed subsequently to access to the memory core that is gained in response to the read command or access to the memory core that is gained for the dummy read; and
- wherein, when the read command or the write command is input in a cycle subsequent to a cycle in which the refresh is started, the control section delays the start of access to the memory core that is gained in response to the read command or the start of access to the memory core that is gained for the dummy read in response to the write command by a predefined period of time in the subsequent cycle.

6. The semiconductor memory device according to claim 1, further comprising:
- a refresh control section that exercises control so that the memory core is refreshed at intervals of a plurality of cycles of a clock;
- wherein data is input and output in burst mode;
- wherein the read command and the write command are input in synchronism with the clock;
- wherein the refresh control section exercises control so that the refresh is not performed in synchronism with the clock but is performed subsequently to access to the memory core that is gained in response to the read command or access to the memory core that is gained for the dummy read; and
- wherein, when the refresh is performed subsequently to the access to the memory core that is gained for the dummy read, the control section delays the start of the late write performed in a cycle subsequent to the dummy read by a predefined period of time in the subsequent cycle.

* * * * *